United States Patent
Chon

(10) Patent No.: US 6,222,782 B1
(45) Date of Patent: Apr. 24, 2001

(54) CONTROL CIRCUIT FOR A BIT LINE EQUALIZATION SIGNAL IN SEMICONDUCTOR MEMORY

(75) Inventor: Min-Jae Chon, Chungcheongbuk-do (KR)

(73) Assignee: Hyundai Electronics Industries Co., Ltd., Kyoungki-do (KR)

( * ) Notice: Subject to any disclaimer, the term of this patent is extended or adjusted under 35 U.S.C. 154(b) by 6 days.

(21) Appl. No.: 09/588,550

(22) Filed: Jun. 7, 2000

(30) Foreign Application Priority Data

Jun. 8, 1999 (KR) .................................................. 99-21159

(51) Int. Cl.[7] ...................................................... G11C 7/00
(52) U.S. Cl. .................... 365/189.09; 365/202; 365/203; 327/536
(58) Field of Search .................................... 365/202, 203, 365/189.09, 189.11; 327/536, 537, 589

(56) References Cited

U.S. PATENT DOCUMENTS

| 5,499,218 | * | 3/1996 | Ahn et al. ........................ 365/230.06 |
| 5,563,831 | * | 10/1996 | Ting .................................. 365/189.09 |
| 5,828,611 | * | 10/1998 | Kaneko et al. ....................... 365/203 |
| 5,828,614 | | 10/1998 | Gradinariu .......................... 365/208 |

\* cited by examiner

*Primary Examiner*—Son Mai

(57) ABSTRACT

A control circuit for a bit line equalization signal in semiconductor memory which equalizes each initial voltage at a bit line and bit bar line, providing sufficient line driving voltage by producing a bit line equalization signal of a higher voltage level if a power voltage level for the circuit has been reduced. A delaying part supplied with a first bit line equalization signal of a first voltage level and outputs the first bit line equalization signal after a period of time. A controller generates a second bit line equalization signal from both the first bit line equalization signal and an output signal of the delaying part. A charge pump raises the voltage level of the first bit line equalization signal up to a second voltage level based on the first bit line equalization signal and the second bit line equalization signal.

11 Claims, 4 Drawing Sheets

CONTROL CIRCUIT FOR A BIT LINE EQUALIZATION SIGNAL IN SEMICONDUCTOR MEMORY

BACKGROUND OF THE INVENTION

1. Field of Invention

The present invention relates to a semiconductor memory, and more particularly, to a control circuit for a bit line equalization signal in the semiconductor memory which equalizes each initial voltage at a bit line and bit bar line.

2. Discussion of Related Art

Bit lines and bit bar lines (also known as complementary bit lines) in semiconductor devices are data signal transferring paths directly connected to memory cells. Data signals are carried to the memory cells, or other data signals read from memory cells, are transferred to a sense amplifier through the bit lines and bit bar lines.

When a data signal is applied to one of the bit line pair (i.e., a bit line and corresponding bit bar line), a voltage difference between the bit line and the bit bar line is generated. The sense amplifier amplifies the voltage difference before transfer to a data bus. Capacitance of a capacitor in a memory cell is usually designed to be small for fast operation and low power consumption so that the voltage difference between the bit line and bit bar line is minute. Therefore, the initial voltage levels of the bit line and bit bar line should be equalized very precisely.

FIG. 1 shows a schematic circuit of a cell array and a sense amplifier which are electrically connected. Referring to FIG. 1, a bit line equalization circuit 102, a memory cell 104, and a sense amplifier 106 are connected to a bit line pair BL and /BL. A sense amplifier driver 108 is connected to the sense amplifier 106.

In the bit line equalization circuit 102, when a bit line equalization signal BLEQ becomes high, NMOS transistors 110, 112, and 114 all turn on, equalizing both the bit line BL and bit bar line /BL to a precharge voltage VBLP. Once the bit line equalization signal BLEQ drops down to a low level, the NMOS transistors 110, 112, and 114 all turn off. Thus, the bit line BL and bit bar line /BL maintain the precharge voltage level, in a floating state.

During this floating state, when a word line WL is activated to turn on an NMOS transistor 116 in the memory cell 104, electric charge transfer occurs between the bit line BL and a cell capacitor 118. Then, the sense amplifier 106 amplifies the resulting voltage difference between the bit line BL and bit bar line /BL. In this case, the voltage amplified by the sense amplifier depends on a PMOS gate voltage CSP and NMOS gate voltage CSN provided by a sense amplifier driver 108. The PMOS gate voltage CSP and the NMOS gate voltage CSN operate as power source voltage and ground voltage, respectively, for the sense amplifier 106.

FIG. 2 shows a bit line equalization signal generator in a semiconductor memory according to a related art. Referring to FIG. 2, a bit line enabling signal BLEIN comes from a mat selection signal. This signal is buffered by buffer 202 to produce a bit line equalization signal BLEQ having VDD and VSS signal levels (where VDD is the upper power supply voltage and VSS is the lower power supply voltage).

Recently, power supply voltages VDD of semiconductor memories have decreased from 5V, to 3.3V, to 2.5V. When 5V semiconductor memory design is transformed to that of 3.3V, or 3.3 to 2.5V, the voltage level of the bit line equalization signal BLEQ is also reduced due to the decreased power source voltage (i.e., 3.3V or 2.5V). Unfortunately, such bit line equalization signal BLEQ fails to provide sufficient driving force.

SUMMARY OF THE INVENTION

Accordingly, the present invention is directed to a control circuit for a bit line equalization signal in a semiconductor memory that substantially obviates one or more of the problems due to limitations and disadvantages of the related art.

One object of the present invention is to provide a control circuit for a bit line equalization signal in a semiconductor memory which has sufficient driving force by securing a bit line equalization signal of a high voltage level even if power voltage level is reduced.

Additional features and advantages of the invention will be set forth in the description which follows and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention includes a control circuit for controlling a bit line equalization signal in a semiconductor memory, including a level shifting portion to receive a bit line equalization signal having a voltage of VDD and to selectively raise the voltage of the bit line equalization signal above VDD, and a control portion to receive the bit line equalization signal and produce a control signal to cause the level shifting portion to raise the voltage of the bit line equalization signal.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this application, illustrate embodiments of the invention and together with the description serve to explain the principle of the invention.

DETAILED DESCRIPTION OF PREFERRED EMBODIMENTS

Reference will now be made in detail to the preferred embodiments of the present invention, examples of which are illustrated in the accompanying drawings.

Figure 1:
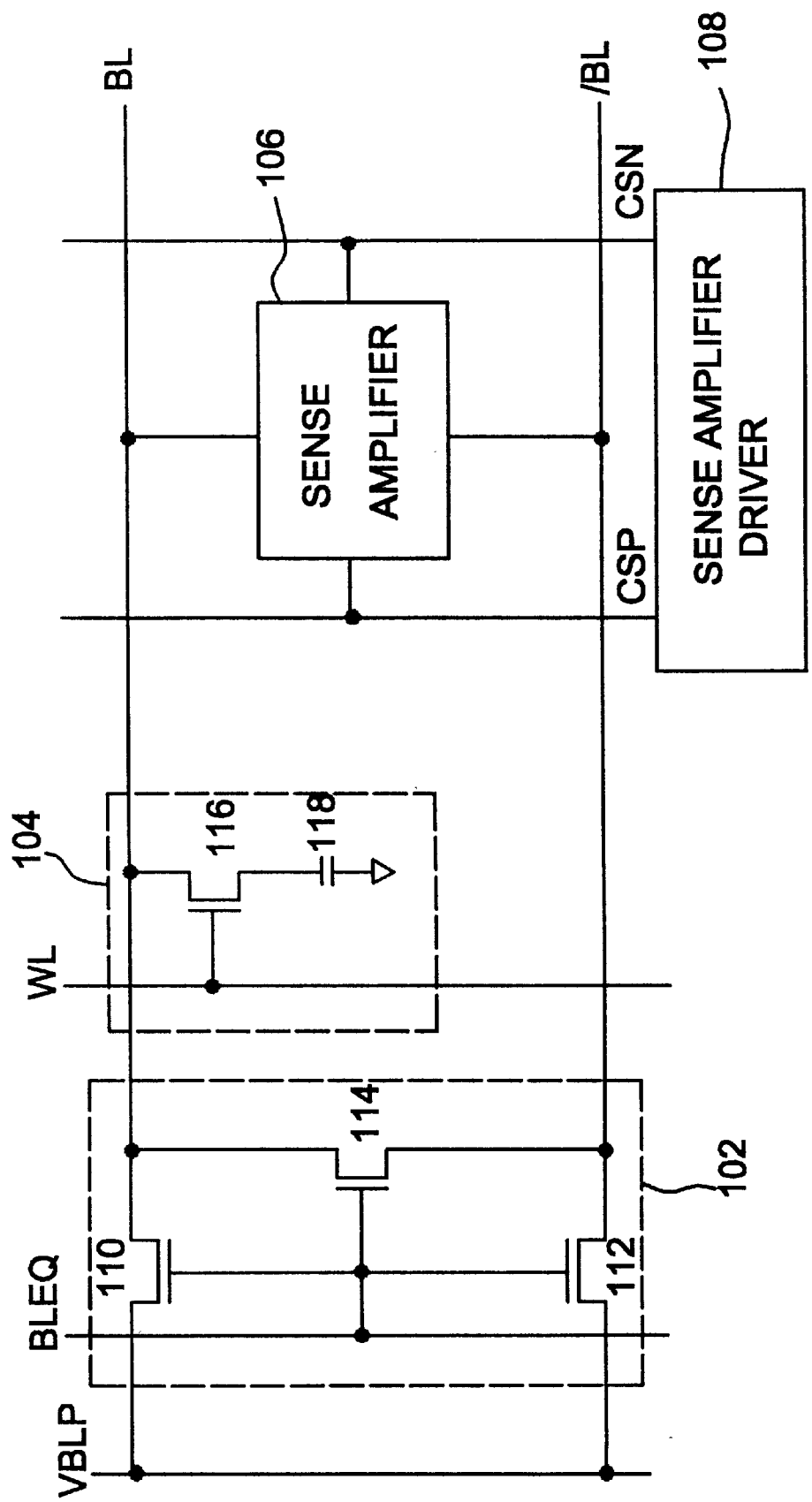
FIG. 1 shows a schematic circuit of a cell array and a sense amplifier which are electrically connected each other according to a related art.
Figure 2:
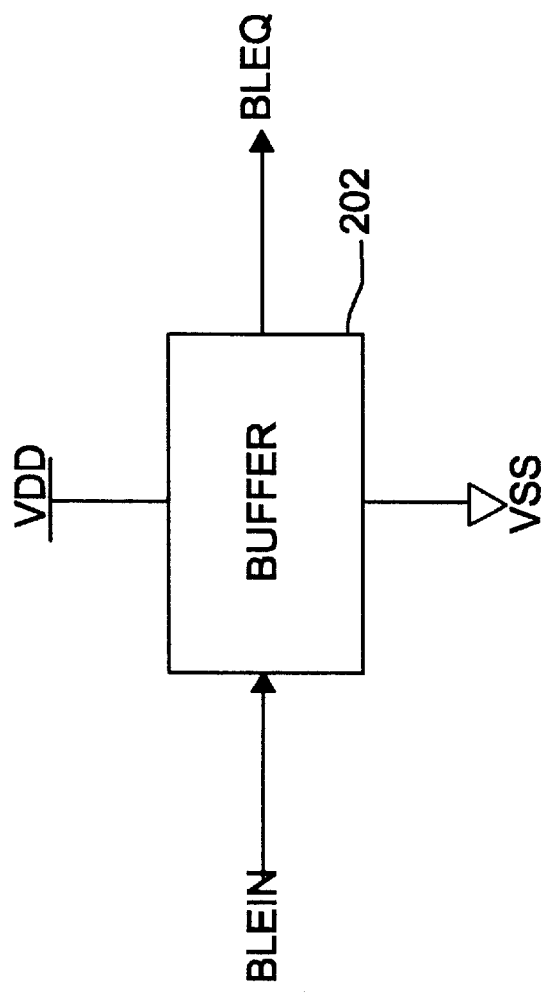
FIG. 2 shows a bit line equalization signal generator in a semiconductor memory according to a related art.
Figure 3:
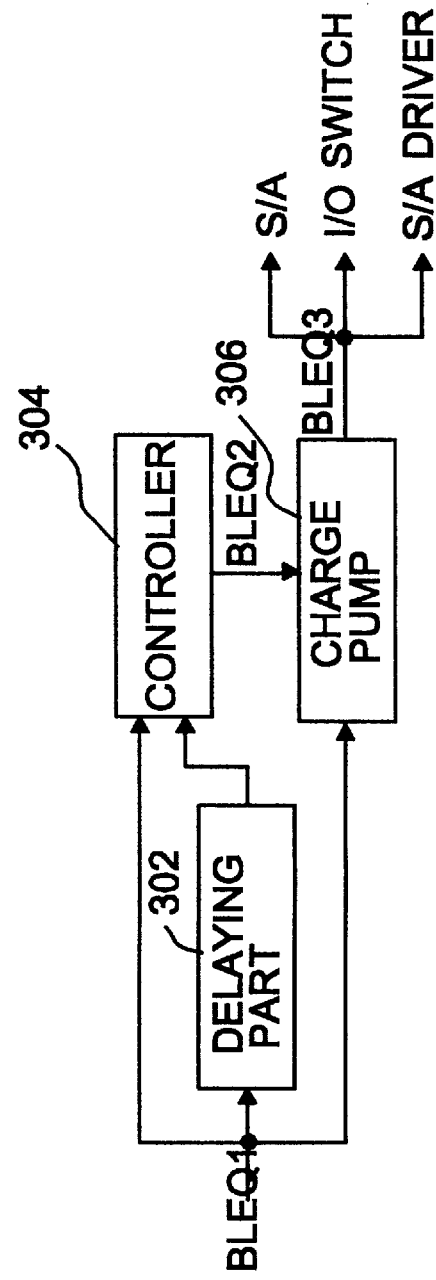
FIG. 3 shows a block diagram of a control circuit for a bit line equalization signal according to the present invention.

FIG. 3 shows a block diagram of a control circuit for a bit line equalization signal according to the present invention.

Referring to FIG. 3, as in the related art, a first bit line equalization signal BLEQ1 having VDD and VSS levels is produced by buffering a bit line enabling signal BLEIN. In this case, a VDD of 2.5V is achieved by reducing the memory voltage during design from to 3.3 to 2.5V.

The first bit line equalization signal BLEQ1 is inputted to a delaying part 302, controller 304, and charge pump 306, respectively. The delaying part 302 delays the first bit line equalization signal BLEQ1, conveying the delayed signal to the controller 304. Namely, the bit line equalization signal BLEQ1 is transferred to the controller 304 in two ways through different paths with a predetermined time interval therebetween.

The controller 304 generates a second bit line equalization signal BLEQ2. The second bit line equalization signal BLEQ2 is a signal having a pulse width corresponding to the time interval between the first bit line equalization signal BLEQ1 and the output signal of the delaying part 302. The second bit line equalization signal BLEQ2 controls the charge pump 306.

The charge pump 306 is supplied with the first bit line equalization signal BLEQ1 and is controlled by the second bit line equalization signal BLEQ2, carrying out charge pumping. A third bit line equalization signal BLEQ3 is generated by the charge pumping. The third bit line equalization signal BLEQ3 of which voltage level is 3.3V is carried to the sense amplifier, I/O switch, and sense amplifier driver. The I/O switch includes switches of a main bit line and sub-bit line.

Figure 4:
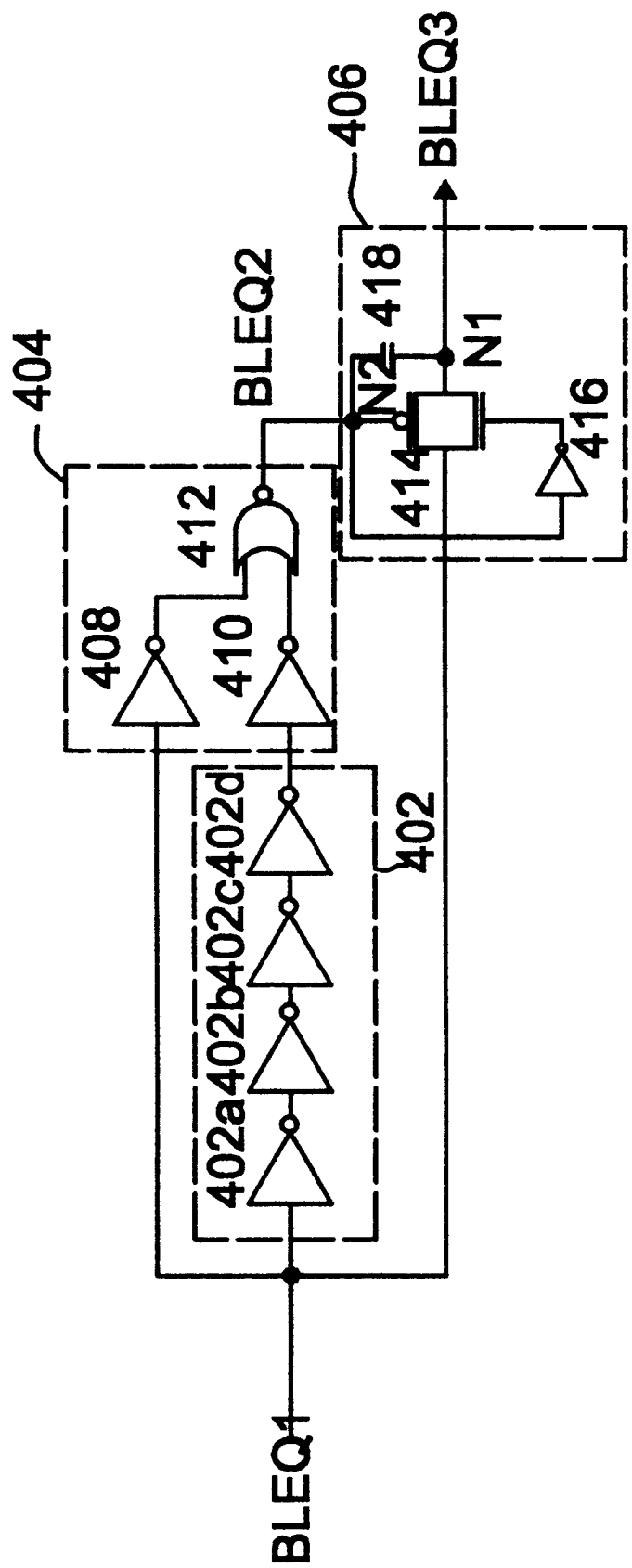
FIG. 4 shows a control circuit for a bit line equalization signal according to the present invention.

FIG. 4 shows a control circuit for a bit line equalization signal according to the embodiment of the present invention shown in FIG. 3.

Referring to FIG. 4, as is the case in FIG. 3, a first bit line equalization signal BLEQ1 is inputted to a delaying part 402, controller 404, and charge pump 406, respectively. The delaying part 402 comprises four inverters 402a to 402d which are connected one another in series forms an inverter chain. The size of the delaying part 402 secures the time which is necessary for an output stage of the charge pump 406 to be charged to the VDD level of 2.5V.

In the controller 404, the first bit line equalization signal BLEQ1 and an output of the delaying part 402 are inverted by the inverters 408 and 410, respectively, and inputted to a NOR gate 412. An output of the NOR gate 412 goes up to high level after an elapse of the delayed time of the delaying part 402 even if the first bit line equalization signal BLEQ1 becomes high level.

The charge pump 406 comprises a transmission gate 414 and capacitor 418. The first bit line equalization signal BLEQ1 is inputted to the transmission gate 414. Switching operation of the transmission gate 414 is achieved by the second bit line equalization signal BLEQ2. The inverter 416 inverts the second bit line equalization signal BLEQ2 to be transferred to a gate of an NMOS transistor of the transmission gate 414. An output of the transmission gate 414 is a third bit line equalization signal BLEQ3.

One plate of the capacitor 418 is supplied with the second bit line equalization signal BLEQ2 while the other plate of the capacitor 418 is connected to an output stage N1 of the transmission gate 414. The voltage difference between both plates of the capacitor 418 is the same as that between the second and third bit line equalization signals BLEQ2 and BLEQ3.

The basic operation of the control circuit for a bit line equalization signal according to the present invention in FIG. 4 will be explained. When the first bit line equalization signal BLEQ1 is low, the second bit line equalization signal BLEQ2 is also low. Therefore, voltage of the node N1 is low (VSS) as the transmission gate 414 becomes turned on. During the above state, provided that the first bit line equalization signal BLEQ1 goes up to high level, the second bit line equalization signal BLEQ2 becomes high (VDD) after a period of time. During this time delay caused by the delaying part 402, the first bit line equalization signal BLEQ1 having a VDD level is carried to the node N1 through the transmission gate 414 which is turned on. The voltage of the node N1 then becomes VDD. In this case, the voltage difference between both plates of the charged capacitor 418 is VDD.

When the second bit line equalization signal BLEQ2 goes high after a period of time due to the delaying part 402, the transmission gate 414 becomes turned off. Simultaneously, VDD is applied to one plate N2 of the capacitor which has been supplied with voltage of a low level, increasing the charge stored by the capacitor 418 (according to the law of electric charge conservation). Thus, the voltage difference between both plates of the capacitor increases, thereby voltage of the third bit line equalization signal BLEQ3 is raised (pumped).

Figure 5:
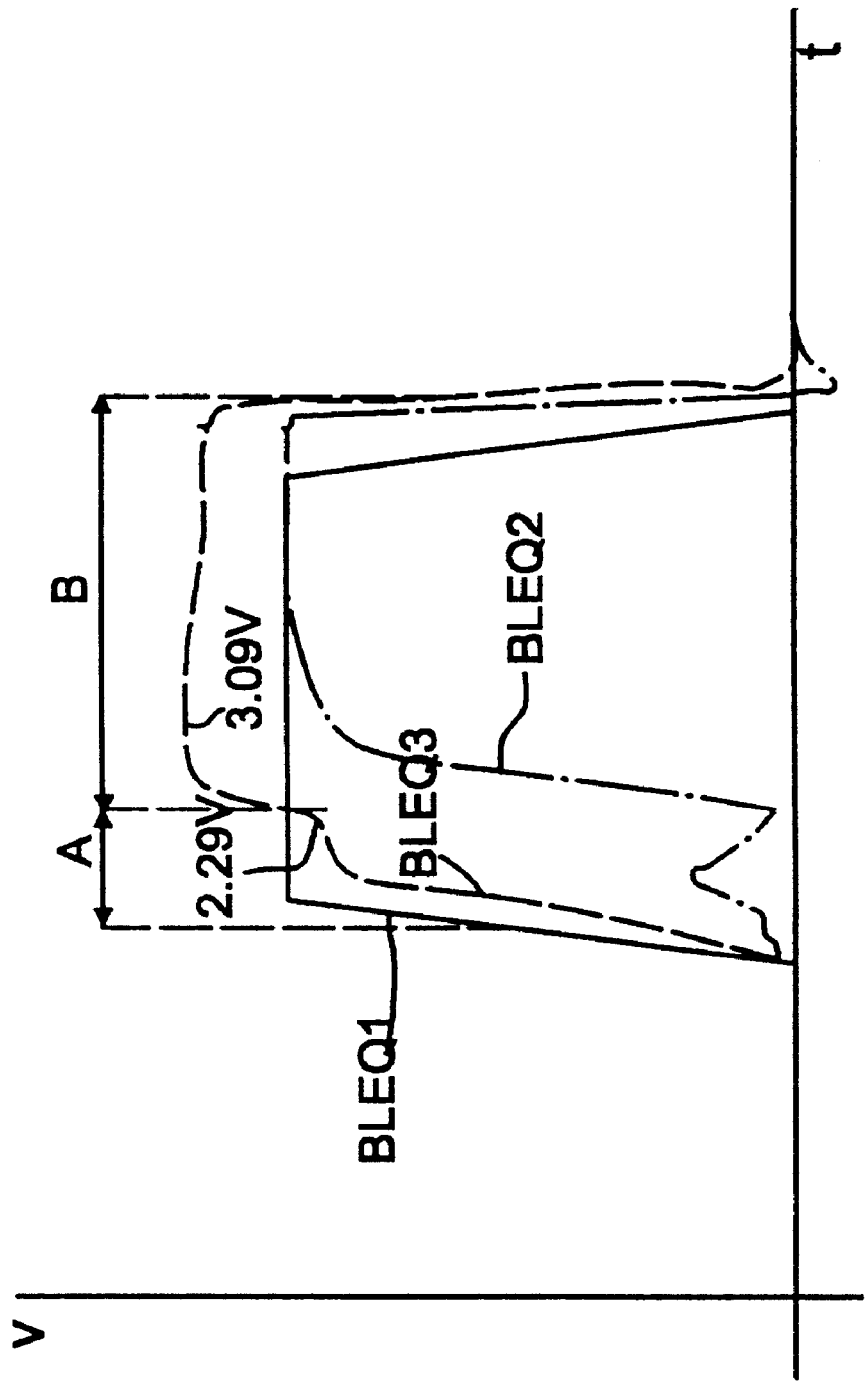
FIG. 5 shows wave forms of operational characteristics of a control circuit for a bit line equalization signal according to the present invention.

FIG. 5 shows wave forms of operational characteristics of a control circuit for a bit line equalization signal according to the present invention. Referring to FIG. 5, a third bit line equalization signal BLEQ3 is unable to exceed 2.5V for a predetermined time A after a first bit line equalization signal has been raised to high level. When time interval B is reached after the time interval A has passed, the voltage of second bit line equalization signal BLEQ2 is raised. Accordingly, voltage level of the third bit line equalization signal BLEQ3 is also raised over 3V. Then, the second and third bit line equalization signals BLEQ2 and BLEQ3 decrease in voltage as the first bit line equalization signal BLEQ1 is dropped.

Accordingly, the present invention provides a control circuit for a bit line equalization signal in semiconductor memory which has sufficient driving force by securing a bit line equalization signal of a higher voltage level even if a power voltage level has been reduced by design.

It will be apparent to those skilled in the art that various modifications and variations can be made in a control circuit for a bit line equalization signal in semiconductor memory of the present invention without departing from the spirit or scope of the inventions. Thus, it is intended that the present invention cover the modifications and variations of this invention provided they come within the scope of the appended claims and equivalents.

What is claimed is:

1. A control circuit for controlling a bit line equalization signal in a semiconductor memory, comprising:

a delaying part receiving a first bit line equalization signal having a first voltage level and outputting a delayed first bit line equalization signal;

a controller generating a second bit line equalization signal from the first bit line equalization signal and the delayed first bit line equalization signal; and a charge pump raising the first voltage level of the first bit line equalization signal to a second voltage level based on the second bit line equalization signal.

2. The control circuit according to claim 1, wherein the delaying part includes a plurality of inverters connected in series.

3. The control circuit according to claim 1, wherein the delay introduced by the delaying part allows an output stage of the charge pump to be charged to the first voltage level.

4. The control circuit according to claim 1, wherein the controller produces a high second bit line equalization signal only when the first bit line equalization signal and the delayed first bit line equalization signal are both high.

5. The control circuit according to claim 4, wherein the controller includes:
 a first inverter inverting the first bit line equalization signal;
 a second inverter inverting the delayed first bit line equalization signal; and
 a NOR gate receiving an output of the first inverter and an output of the second inverter, the NOR gate outputting the second bit line equalization signal.

6. The control circuit according to claim 1, wherein the first voltage level is VDD.

7. The control circuit according to claim 1, wherein the charge pump includes:
 a transmission gate receiving the first bit line equalization signal, the transmission gate outputting a third bit line equalization signal; and
 a capacitor, one plate of which receives the second bit line equalization signal and another plate of which receives the third bit line equalization signal, wherein the capacitor is charged when the second bit line equalization signal is low.

8. A control circuit for controlling a bit line equalization signal in a semiconductor memory, comprising:
 a level shifting portion to receive a bit line equalization signal having a voltage of VDD and to selectively raise the voltage of the bit line equalization signal above VDD; and
 a control portion to receive the bit line equalization signal and produce a control signal to cause the level shifting portion to raise the voltage of the bit line equalization signal.

9. The control circuit according to claim 8, wherein the control portion includes
 a delaying part to output a delayed bit line equalization signal; and
 a controller to generate the control signal when the delayed bit line equalization signal has a voltage of VDD.

10. The control circuit according to claim 8, wherein the level shifting portion includes
 a charge storage element to store charge prior to the generation of the control signal and to raise the voltage of the bit line equalization signal after the generation of the control signal.

11. The control circuit according to claim 10, wherein the level shifting portion includes
 a voltage transfer element controlled by the control signal to output the bit line equalization signal and to cause the charge storage element to store charge.

* * * * *